(12) United States Patent
Zhang et al.

(10) Patent No.: US 9,153,713 B2
(45) Date of Patent: Oct. 6, 2015

(54) SOLAR CELL MODULES AND METHODS OF MANUFACTURING THE SAME

(75) Inventors: Lingjun Zhang, Suzhou (CN); Jian Shen, Suzhou (CN); Xusheng Wang, Suzhou (CN); Jian Wu, Suzhou (CN); Feng Zhang, Suzhou (CN)

(73) Assignee: CSI CELLS CO., LTD, Suzhou (CN)

( * ) Notice: Subject to any disclaimer, the term of this patent is extended or adjusted under 35 U.S.C. 154(b) by 969 days.

(21) Appl. No.: 13/193,470

(22) Filed: Jul. 28, 2011

(65) Prior Publication Data

US 2012/0247529 A1    Oct. 4, 2012

(30) Foreign Application Priority Data

| Apr. 2, 2011 | (CN) | 2011 3 0065596 |
| May 27, 2011 | (CN) | 2011 1 0140708 |
| May 27, 2011 | (CN) | 2011 1 0141248 |
| May 27, 2011 | (CN) | 2011 1 0141250 |
| May 27, 2011 | (CN) | 2011 1 0141259 |
| May 27, 2011 | (CN) | 2011 1 0141575 |
| May 27, 2011 | (CN) | 2011 1 0141621 |
| May 27, 2011 | (CN) | 2011 2 0175836 U |
| May 27, 2011 | (CN) | 2011 2 0176094 U |

(51) Int. Cl.
*H01L 31/0224* (2006.01)
*H01L 31/05* (2014.01)

(52) U.S. Cl.
CPC ...... *H01L 31/02245* (2013.01); *H01L 31/0516* (2013.01); *Y02E 10/50* (2013.01)

(58) Field of Classification Search
CPC ............... H01L 31/05; H01L 31/0224; H01L 31/02245; H01L 31/0516; Y02E 10/50

USPC .................. 136/244, 250, 252, 256
See application file for complete search history.

(56) References Cited

U.S. PATENT DOCUMENTS

| 3,903,428 A | 9/1975 | DeJong |
| 4,104,091 A | 8/1978 | Evans, Jr. et al. |
| 4,227,942 A | 10/1980 | Hall |
| 4,427,839 A | 1/1984 | Hall |
| 4,626,613 A | 12/1986 | Wenham et al. |

(Continued)

FOREIGN PATENT DOCUMENTS

| CA | 2530684 A1 | 1/2005 |
| CA | 2530743 A1 | 2/2005 |

(Continued)

OTHER PUBLICATIONS

Sinton, R.A. (Oct. 1986). "27.5-Percent Silicon Concentrator Solar Cell," *IEEE Electron Device Letters* ED-7(10):567-569.

(Continued)

*Primary Examiner* — Susan D Leong
(74) *Attorney, Agent, or Firm* — Morrison & Foerster LLP

(57) ABSTRACT

Back contact solar cell modules and methods of manufacturing the same. The solar cell module comprises a back surface with a plurality of first electrodes and a plurality of second electrodes formed thereon, the plurality of first electrodes and the plurality of second electrodes being of opposite polarities, the back surface being configured to form an electric field thereon of the opposite polarity as the plurality of first electrodes; a first connecting strip electrically connecting the plurality of first electrodes; and an insulative member between the back surface and the first connecting strip.

30 Claims, 17 Drawing Sheets

(56) References Cited

U.S. PATENT DOCUMENTS

| | | | |
|---|---|---|---|
| 4,838,952 A | 6/1989 | Dill et al. | |
| 6,384,317 B1 | 5/2002 | Kerschaver et al. | |
| 7,851,696 B2 | 12/2010 | Mueller et al. | |
| 2004/0063326 A1 | 4/2004 | Szlufcik et al. | |
| 2007/0012352 A1* | 1/2007 | Wohlgemuth et al. | 136/251 |
| 2008/0121266 A1* | 5/2008 | Tsunomura et al. | 136/244 |
| 2009/0050190 A1* | 2/2009 | Nishida et al. | 136/244 |
| 2009/0084437 A1 | 4/2009 | Nishida et al. | |
| 2009/0178707 A1 | 7/2009 | Moon et al. | |
| 2009/0188550 A1 | 7/2009 | Moon et al. | |
| 2009/0256254 A1 | 10/2009 | Burdick, Jr. et al. | |
| 2010/0218818 A1 | 9/2010 | Kang et al. | |
| 2010/0243040 A1 | 9/2010 | Kim | |
| 2010/0258176 A1 | 10/2010 | Kang et al. | |
| 2010/0258177 A1 | 10/2010 | Ko et al. | |
| 2010/0258178 A1 | 10/2010 | Jang et al. | |
| 2010/0275987 A1 | 11/2010 | Sakamoto et al. | |
| 2010/0276772 A1 | 11/2010 | Ozaki et al. | |
| 2010/0319766 A1 | 12/2010 | Suh | |
| 2010/0326504 A1 | 12/2010 | Park et al. | |
| 2011/0000530 A1 | 1/2011 | Mihailetchi | |
| 2011/0005582 A1 | 1/2011 | Szlufcik et al. | |
| 2011/0041906 A1 | 2/2011 | Jang et al. | |
| 2011/0048529 A1 | 3/2011 | Lee et al. | |
| 2011/0057283 A1 | 3/2011 | Tsunemi et al. | |
| 2011/0120548 A1 | 5/2011 | Chen et al. | |
| 2011/0139241 A1 | 6/2011 | Clement et al. | |
| 2011/0174355 A1 | 7/2011 | Biro et al. | |
| 2011/0253211 A1 | 10/2011 | Krokoszinski | |
| 2012/0006393 A1 | 1/2012 | Cruz et al. | |
| 2012/0138137 A1 | 6/2012 | Chen et al. | |
| 2012/0288980 A1 | 11/2012 | Moon et al. | |
| 2012/0298192 A1 | 11/2012 | Zhang et al. | |
| 2012/0301997 A1 | 11/2012 | Zhang et al. | |
| 2013/0008501 A1 | 1/2013 | Guillevin et al. | |

FOREIGN PATENT DOCUMENTS

| | | |
|---|---|---|
| CA | 2596827 A1 | 8/2005 |
| CN | 101556975 A | 10/2009 |
| CN | 101587922 A | 11/2009 |
| CN | 101889349 A | 11/2010 |
| CN | 101894888 A | 11/2010 |
| CN | 101937945 A | 1/2011 |
| CN | 102208486 A | 10/2011 |
| DE | 10 2008 033 632 A1 | 1/2010 |
| DE | 102008044910 A1 | 3/2010 |
| DE | 102009047778 A1 | 9/2010 |
| EP | 0 985 233 B1 | 2/2007 |
| EP | 2 068 369 A1 | 6/2009 |
| EP | 2 410 574 A2 | 1/2012 |
| JP | 58-039071 A | 3/1983 |
| JP | 62108579 A | 5/1987 |
| JP | 4-223378 A2 | 8/1992 |
| JP | 9-150482 A | 6/1997 |
| JP | 2000-150929 A | 5/2000 |
| JP | 2008-034609 A | 2/2008 |
| JP | 2008300440 A | 12/2008 |
| JP | 2009059921 A | 3/2009 |
| JP | 2009-088406 A | 4/2009 |
| JP | 2009-130117 A | 6/2009 |
| JP | 2009-158575 A | 7/2009 |
| JP | 2009-182260 A | 8/2009 |
| JP | 2010-080576 A | 4/2010 |
| JP | 2010-080578 A | 4/2010 |
| JP | 2010-262951 A | 11/2010 |
| KR | 20090077529 A | 7/2009 |
| KR | 10-20100098993 A | 9/2010 |
| KR | 100984700 B1 | 10/2010 |
| KR | 10-20100118292 A | 11/2010 |
| KR | 20100123164 A | 11/2010 |
| KR | 2010135618 A | 12/2010 |
| KR | 2011-0011053 A | 2/2011 |
| KR | 20110024947 A | 3/2011 |
| KR | 101032624 A | 5/2011 |
| NL | 2001015 C2 | 8/2009 |
| WO | WO-89/05521 A1 | 6/1989 |
| WO | WO-9109427 A1 | 6/1991 |
| WO | WO-98/54763 A1 | 12/1998 |
| WO | WO-03/072500 A1 | 9/2003 |
| WO | WO-2008/078741 A1 | 7/2008 |
| WO | WO-2009/071561 A2 | 6/2009 |
| WO | WO-2009/071561 A3 | 6/2009 |
| WO | WO-2010/015310 A2 | 2/2010 |
| WO | WO-2010/015310 A3 | 2/2010 |
| WO | WO-2010/022911 A2 | 3/2010 |
| WO | WO-2010/022911 A3 | 3/2010 |
| WO | WO-2010/022911 A8 | 3/2010 |
| WO | WO-2010/022911 C1 | 3/2010 |
| WO | WO-2010/027265 A2 | 3/2010 |
| WO | WO-2010/027265 A3 | 3/2010 |
| WO | WO-2010/097268 A2 | 9/2010 |
| WO | WO-2010/097268 A3 | 9/2010 |
| WO | WO-2010/126346 A2 | 11/2010 |
| WO | WO-2010/126346 A3 | 11/2010 |
| WO | WO-2010/126346 A4 | 11/2010 |

OTHER PUBLICATIONS

U.S. Appl. No. 13/193,433, filed Jul. 28, 2011, by Zhang et al.
U.S. Appl. No. 13/193,458, filed Jul. 28, 2011, by Zhang et al.
Florian Clement et al., Industriallyfeasiblemulti-crystallinemetalwrapthrough(MWT)silicon solar cellsexceeding16%efficiency, Solar EnergyMaterials&SolarCells, Available online on Jan. 20, 2009.
U.S. Appl. No. 14/517,697, filed Oct. 17, 2014, by Zhang et al.

* cited by examiner

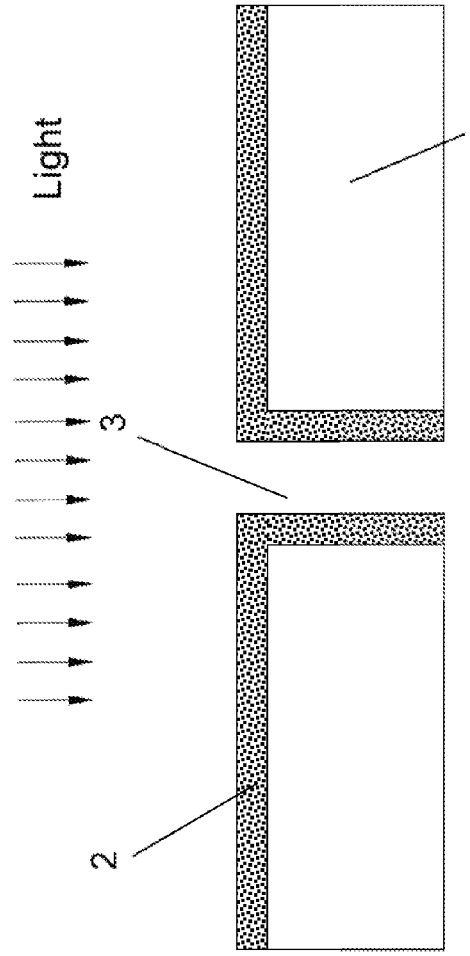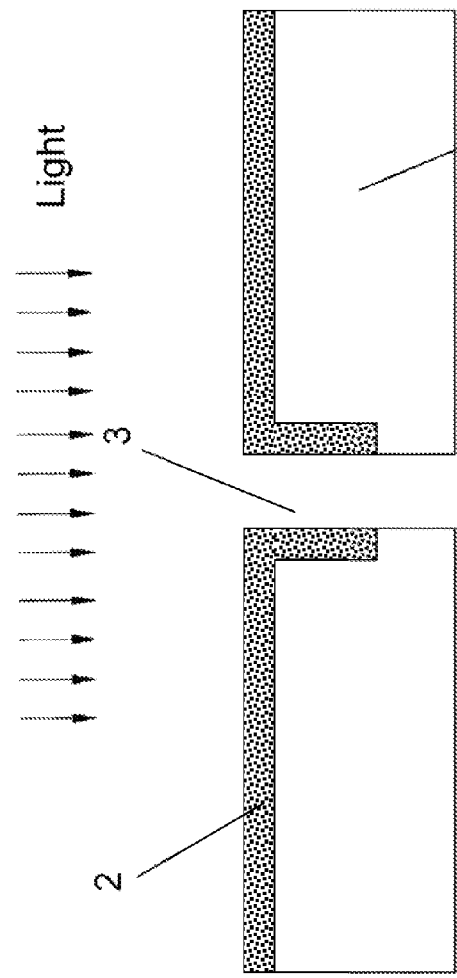

SOLAR CELL MODULES AND METHODS OF MANUFACTURING THE SAME

CROSS-REFERENCE TO RELATED APPLICATIONS

This application claims the benefit of priority to Chinese Patent Application Numbers 201110140708.3, 201120175836.7, 201120176094.X, 201110141250.3, 201110141621.8, 201110141259.4, 201110141575.1, and 201110141248.6, filed May 27, 2011, which are incorporated by reference herein in their entirety. This application also claims priority to Chinese Patent Application No. 201130065596.0, filed Apr. 2, 2011, which is hereby incorporated by reference in its entirety. This application is also related to U.S. patent application Ser. No. 13/193,433 entitled "Light to Current Converter Devices and Methods of Manufacturing the Same" and U.S. patent application Ser. No. 13/193,458 entitled "Methods of Manufacturing Light to Current Converter Devices", which are incorporated by reference herein in its entirety.

BACKGROUND

Provided herein are solar cell modules and methods of manufacturing the same, and, more particularly, back contact solar cell modules and methods of manufacturing the same.

In a back contact solar cell, also known as back electrodes solar cell, the positive electrodes and the negative electrodes are located on a same back surface of the cell body. Compared to the traditional silicon solar cell, the back contact solar cell has no bus bars on the front surface of the cell body to block the light. Thus, the area absorbing the lights is enlarged, helping to increase the efficiency of the solar cell. Furthermore, since both the positive electrodes and the negative electrodes are formed on the same back surface, the manufacturing process can be simplified. The removal of the bus bar from the front surface of the cell body also improves the appearance of the solar cell. As a result, back contact solar cell has becoming more and more popular, and has been gradually gaining acceptance by the solar industry.

During the manufacturing process of a back contact solar cell, it is necessary to electrically connect the adjacent solar cells. If the back surface forms a positive electric field, the array of the negative electrodes on the back surface need be connected by a negative connecting strip, but it often leads to a short circuit between the positive electric field on the back surface and the negative connecting strip. If the back surface forms a negative electric field, the array of the positive electrodes on the back surface need be connected by a positive connecting strip, but it often leads to a short circuit between the negative electric field on the back surface and the positive connecting strip. Thus, a solution is needed to avoid short circuit during the connecting of adjacent solar cells in a back contact solar cell module.

BRIEF SUMMARY

The embodiments of the present invention provide back contact solar cell modules in which a first connecting strip connecting the first electrodes on the back surface is insulated from the electric field formed on the back surface that is of opposite polarity from the first electrodes.

The embodiments of the present invention also provides method of making back contact solar cell modules comprising insulating a first connecting strip connecting the first electrodes on the back surface from the electric field formed on the back surface that is of opposite polarity from the first electrodes.

In accordance with one embodiment, a solar cell module comprise a solar cell comprising a back surface with a plurality of first electrodes and a plurality of second electrodes formed thereon, the plurality of first electrodes and the plurality of second electrodes being of opposite polarities, the back surface being configured to form an electric field thereon of the opposite polarity as the plurality of first electrodes; a first connecting strip electrically connecting the plurality of first electrodes; and an insulative member between the back surface and the first connecting strip.

In accordance with another embodiment, the insulative member is an insulative strip separable from the back surface of the solar cell.

In accordance with another embodiment, the insulative strip comprises a material selected from the group consisting of expandable polyethylene (EPE), thermoplastic elastomer (TPE), polyvinyl fluoride composite membrane (TPT), and silicon.

In accordance with another embodiment, the insulative strip comprises a plurality of through holes through which the first connecting strip is connected to the plurality of first electrodes.

In accordance with another embodiment, an end of the insulative strip extends beyond an edge of the back surface.

In accordance with another embodiment, the insulative member comprises an insulative material adhered to the back surface.

In accordance with another embodiment, the insulative material comprises silicone.

In accordance with another embodiment, the first connecting strip comprises a base strip and a plurality of projections projecting from a surface on which the base strip resides.

In accordance with another embodiment, the plurality of projections correspond to the plurality of first electrodes, and each projection projects into a through hole to electrically connect to a corresponding first electrodes.

In accordance with another embodiment, the plurality of first electrodes protrude out of the back surface.

In accordance with another embodiment, the solar cell module further comprises a second connecting strip electrically connecting the plurality of second electrodes.

In accordance with another embodiment, the solar cell module further comprises a connection member electrically connecting the second connecting strip.

In accordance with another embodiment, the plurality of first electrodes are rectangle-shaped.

In accordance with another embodiment, a solar cell module comprises a first solar cell and a second solar cell adjacent to the first solar solar, each of the first solar cell and the second solar cell comprising a front surface configured to be exposed to light and a back surface with a plurality of first electrodes and a plurality of second electrodes formed thereon, the plurality of first electrodes and the plurality of second electrodes being of opposite polarities, the back surface being configured to form an electric field thereon of the opposite polarity as the plurality of first electrodes; a first connecting strip electrically connecting the plurality of first electrodes; a second connecting strip electrically connecting the plurality of second electrodes; and an insulative member between the back surface and the first connecting strip; and a connection member electrically connecting the second connecting strip of the first solar cell and the first connecting strip of the second solar cell.

In accordance with another embodiment, the insulative strip comprises a plurality of through holes corresponding to the plurality of first electrodes, and the first connecting strip comprises a plurality of projections for projecting into the plurality of through holes to electrically connect to the plurality of first electrodes.

In accordance with another embodiment, the connection member is located on the back surface of the first solar cell and connected to the second connecting strip of the first solar cell.

In accordance with another embodiment, the connection member is located on the back surface of the second solar cell and connected to the first connecting strip of the second solar cell.

In accordance with another embodiment, the solar cell module further comprises a second insulative member between the connection member and the back surface of the second solar cell.

In accordance with another embodiment, a method of manufacturing a solar cell module comprises forming a first solar cell and a second solar cell adjacent to the first solar solar, each of the first solar cell and the second solar cell comprising a front surface configured to be exposed to light and a back surface with a plurality of first electrodes and a plurality of second electrodes formed thereon, the plurality of first electrodes and the plurality of second electrodes being of opposite polarities, the back surface being configured to form an electric field thereon of the opposite polarity as the plurality of first electrodes; connecting the plurality of second electrodes electrically through a second connecting strip in each of the first solar cell and the second solar cell; forming an insulative member around the plurality of first electrodes in each of the first solar cell and the second solar cell; connecting the plurality of first electrodes electrically through a first connecting strip in each of the first solar cell and the second solar cell, wherein said insulative member is located said first strip and the back surface in each of the first solar cell the second solar cell; and connecting the second connecting strip of the first solar cell and the first connecting strip of the second solar cell electrically through a connection member.

In accordance with another embodiment, the method of manufacturing a solar cell module further comprises forming a plurality of projections on the first connecting strip corresponding to the plurality of first electrodes; and connecting each of the plurality of projections on the first connecting strip with a corresponding first electrode electrically.

In accordance with another embodiment, forming the insulative member comprises depositing an insulative material on the back surface where the first connecting strip is located and the plurality of first electrodes are not located.

In accordance with another embodiment, forming the insulative member comprise providing an insulative strip on the back surface where the first connecting strip is located, the insulative strip comprises a plurality of through holes corresponding to the plurality of first electrodes.

BRIEF DESCRIPTION OF THE DRAWINGS

FIGS. 10-13 are cross-sectional views of exemplary P-N junctions according to various embodiments.

DETAILED DESCRIPTION

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

As used herein and in the appended claims, the singular forms "a," "an," and "the" include plural reference unless the context clearly indicates otherwise. Additionally, the terms "comprises" and "comprising" should be interpreted as referring to elements, components, or steps in a non-exclusive manner, indicating that the referenced elements, components, or steps may be present, or utilized, alone or in combination with other elements, components, or steps that are not expressly referenced.

Exemplary embodiments of solar cell modules will now be discussed with reference to FIGS. 1-9. Metallization Wrap Through ("MWT") back contact solar cells are used in such exemplary embodiments. However, the applications of the present invention is not limited to MWT back contact solar cells, but can be extended to other type of solar cells, such as Metallization Wrap Around ("MWA") or Emitter Wrap Through ("EWT") solar cells.

Figure 1:
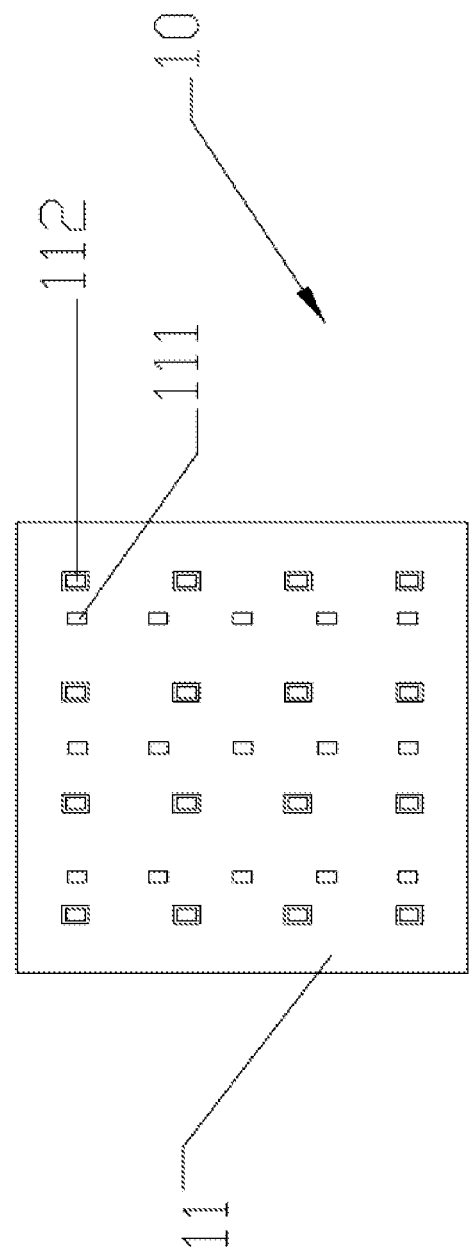
FIG. 1 is a schematic perspective view of the back surface of a solar cell in accordance with an exemplary embodiment of the present invention.

A solar cell module can be formed by electrically connecting an array of solar cells in series with each other, and packaging them into an enclosure. The solar cell module can be used to absorb sun light, and convert the sun light into electricity. FIG. 1 illustrates the back surface 11 of an exemplary solar cell 10 in accordance with the MWT technology.

A solar cell typically comprises two or more semiconductor plates. The semiconductor typically used in solar cell is silicon, including mono-crystalline silicon, polycrystalline silicon and amorphous silicon. When light impinges upon the front surface of a solar cell, electrical charges will be accumulated on the two sides of the cell to create a voltage. This is the photovoltaic effect, which generates an electromotive force on the two sides of the solar cell converting light into electricity. For a MWT solar cell, the front surface of the cell (not shown) typically contains a plurality arrays of metal bus bars (not shown) to collect the electric current generated by the impinging light. The back surface 11 has a plurality of positive electrodes 111 and a plurality of negative electrodes 112. Since the a positive electric field will be generated on the back surface 11 printed with an aluminium paste, the negative electrodes 112 must be insulated from the positive electric field and the positive electrodes 111. For example, as shown in FIG. 1, an insulative area around the negative electrode 112 may be formed to prevent an electrical connection between the negative electrode 112 and the positive electric field. The insulative area can formed by laser etching, or other methods. The negative electrodes 112 are connected to the metal bus bars on the front surface through via holes (not shown) in the solar cell. The via holes can be obtained by laser drilling, and an metal layer can be formed on the inner surface of the via holes for electrically connecting the metal bus bars of the front surface and the negative electrodes 112 of the back surface so that the current from the metal bus bars can be transferred to the negative electrodes on the back surface. The MWT technology is known in the art, and had been disclosed in various prior art, such as EP0985233B1.

As shown in FIG. 1, the back surface of the solar cell in this exemplary embodiment has a plurality of arrays of positive electrodes 111 and negative electrodes 112, each array of electrodes has at least two electrodes 111/112. The electrodes 111/112 are of rectangle shape. Of course, in other embodiments, the shape, number, and pattern of the electrodes can be varied depending on the requirement of particular application.

As shown in FIGS. 2-7, the solar cell module also includes several positive connecting strips 31 for electrically connecting an array of positive electrodes 111, several negative connecting strips 32 for electrically connecting an array of negative electrodes 112, several insulative members 20 between the negative connecting strips 32 and the back surface 11 of the solar cell 10, and a connecting member 33 for electrically connecting with an adjacent solar cell.

Figure 2:
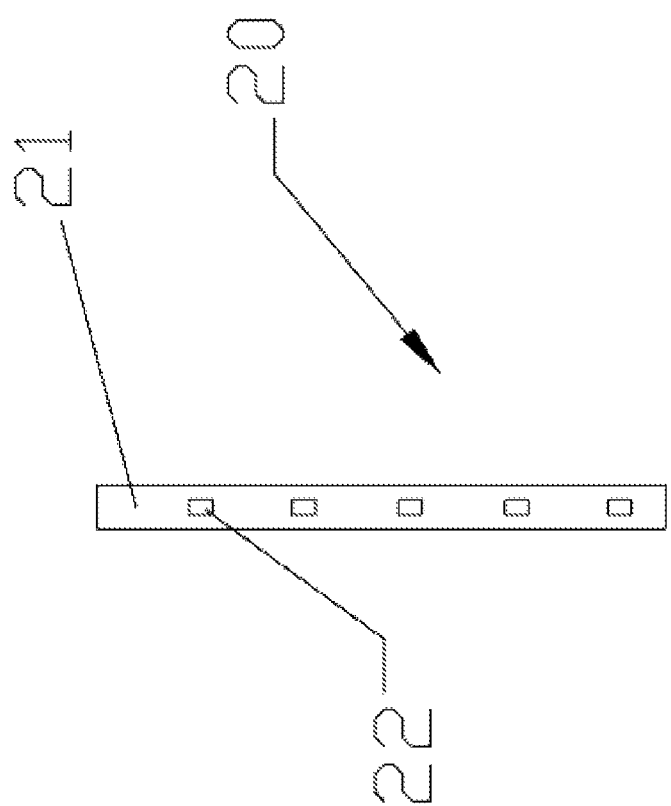
FIG. 2 is a schematic perspective view of an insulative strip for insulating the negative electrodes and the back surface of a solar cell in accordance with an exemplary embodiment of the present invention.
Figure 3:
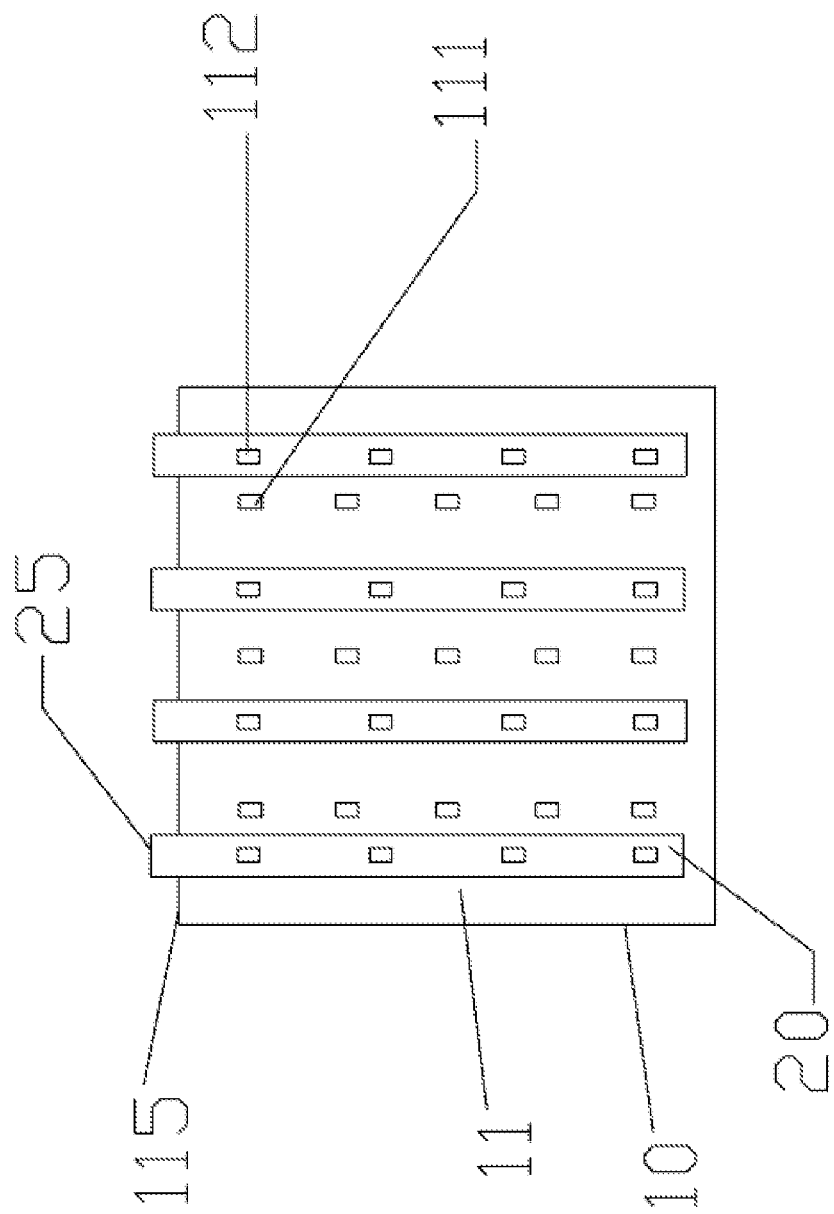
FIG. 3 is a schematic perspective view showing the insulative strip of FIG. 2 being attached to the back surface of a solar cell in accordance with an exemplary embodiment of the present invention.

As shown in FIG. 2, in an exemplary embodiment, the insulative member 20 is an insulative strip that is separable from the back surface 11 of the solar cell 10. The insulative member 20 is made of an insulative material, such as expandable polyethylene (EPE), thermoplastic elastomer (TPE), polyvinyl fluoride composite membrane (TPT), or silicon. The insulative strip 20 is of rectangle shape, and has a main body 21 with a plurality of rectangle shaped holes 22 corresponding to the negative electrodes 112. The distance between two adjacent holes 22 is substantially equal to the distance between two adjacent negative electrodes 112. In another embodiment, the distance between two adjacent holes 22 is slightly larger than the distance between two adjacent negative electrodes 112; but all the negative electrodes 112 can go through the holes 22, and the size of the negative electrodes 112 is slightly smaller than the size of the holes 22. In another embodiment, the shape of the holes 22 can be different from the shape of the negative electrodes 112. For example, the holes 22 can be round, but the holes are bigger enough to allow the negative electrodes 112 to go through. In yet another embodiment, the insulative member 20 is an insulative layer adhered to the back surface 11, such as silica gel painted to the area around the negative electrodes 112 so that the negative connecting strips 32 can be electrically isolated from the back surface 11 of the solar cell 10.

Figure 4:
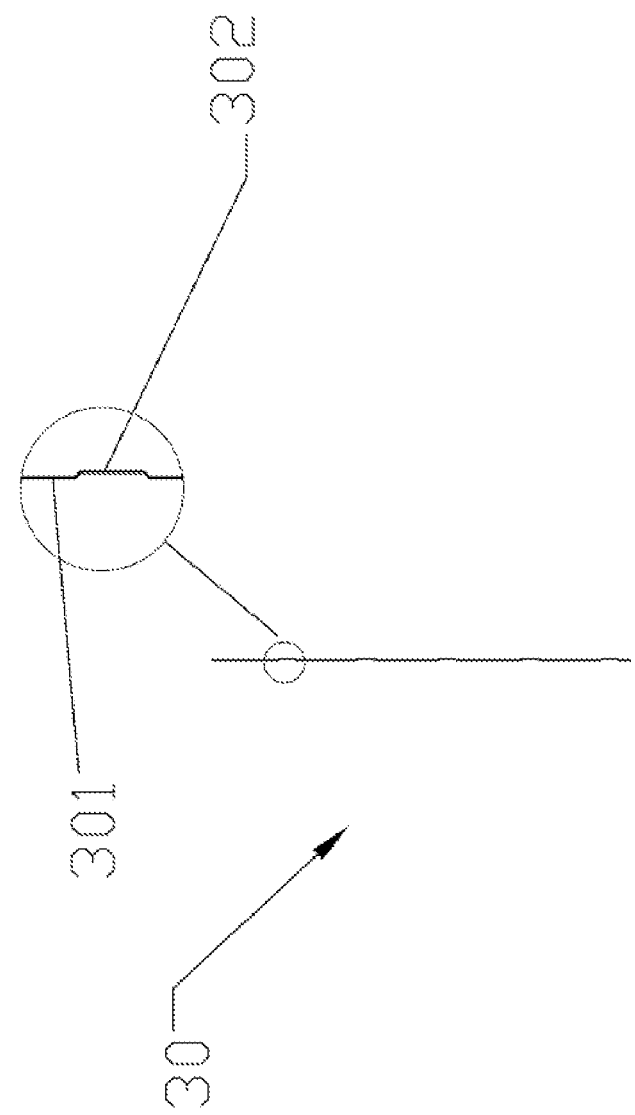
FIG. 4 is a schematic cross-sectional view of a negative connection strip in accordance with an exemplary embodiment of the present invention.
Figure 5:
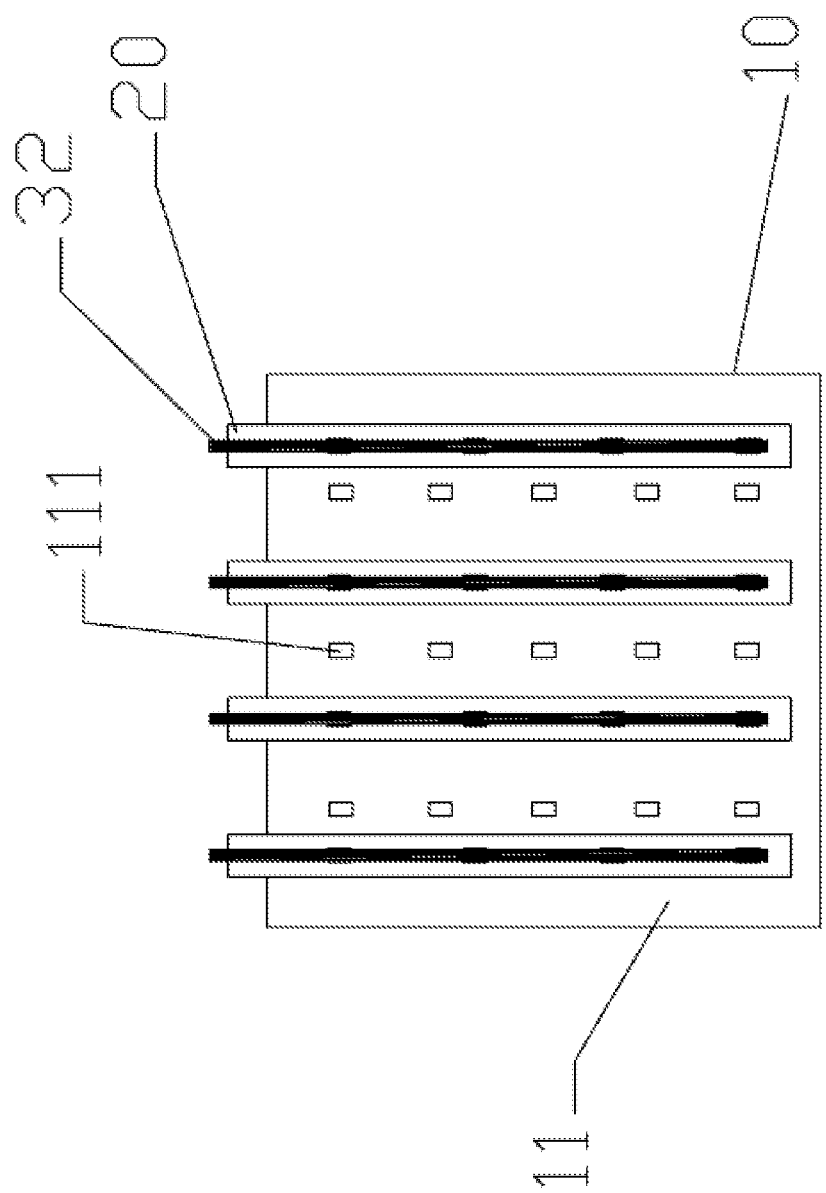
FIG. 5 is a schematic perspective view showing the negative connection strips of FIG. 4 being attached to the back surface of a solar cell in accordance with an exemplary embodiment of the present invention.

In one embodiment, the positive connecting strips 31 and the negative connecting strips 32 are welding strips 30. As shown in FIG. 4, the welding strip 30 has a longitudinal base 301 and a plurality of projections 302 projecting from the longitudinal base 301. The number of projections 302 on each positive connecting strip 31 and negative connecting strip 32 is the same as the number of negative electrodes 112 and positive electrodes 111 in each array of negative electrodes 112 and positive electrodes 111, and the distance between two adjacent projections 302 is the same as the distance between two adjacent negative electrodes 112 and two adjacent positive electrodes 111. When the welding strip 30 is welded to the back surface 11 of the solar cell, the projections 302 electrically connect to the negative electrodes 112 on the back surface 11 through the through holes 22 of the insulative member 20. The projections 302 can be an integral part of the base 301, and be formed by bending or stamping. The projections 302 can also be formed by attaching something to the surface of the base 301, such as by welding. In one embodiment, the width of the welding strip 30 is roughly the same as the width of the negative electrodes 112, and the base 301 is bended to form the projections 302 for easy assembly. In one embodiment, there is no insulative member 20 between the positive connecting strip 31 and the back surface 11. Thus, it is not necessary to form the projections 302, and the positive connecting strip 31 is not bended. In another embodiment, the positive connecting strip 31 is replaced by a longitudinal positive electrode. In yet another embodiment, the array of negative electrodes 112 forms a longitudinal unitary negative electrode, and the through hole 22 on the insulative strip 20 is also a longitudinal through hole corresponding to the longitudinal unitary negative electrode, and the base 301 only needs one longitudinal projection 302 corresponding to the longitudinal unitary negative electrode. In one embodiment, the connecting member 33 is a metal strip which electrically connects the negative connecting strip 32 of one solar cell with the positive connecting strip 31 of an adjacent solar cell.

Figure 6:
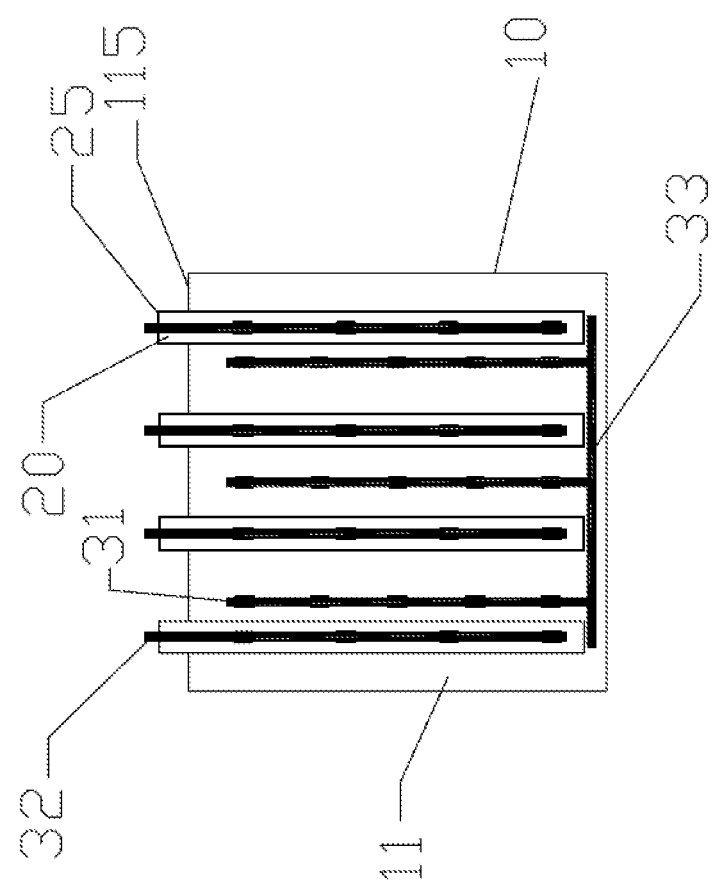
FIG. 6 is a schematic perspective view showing positive connection strips and a connection member being further attached to the back surface of a solar cell of FIG. 5 in accordance with an exemplary embodiment of the present invention.
Figure 7:
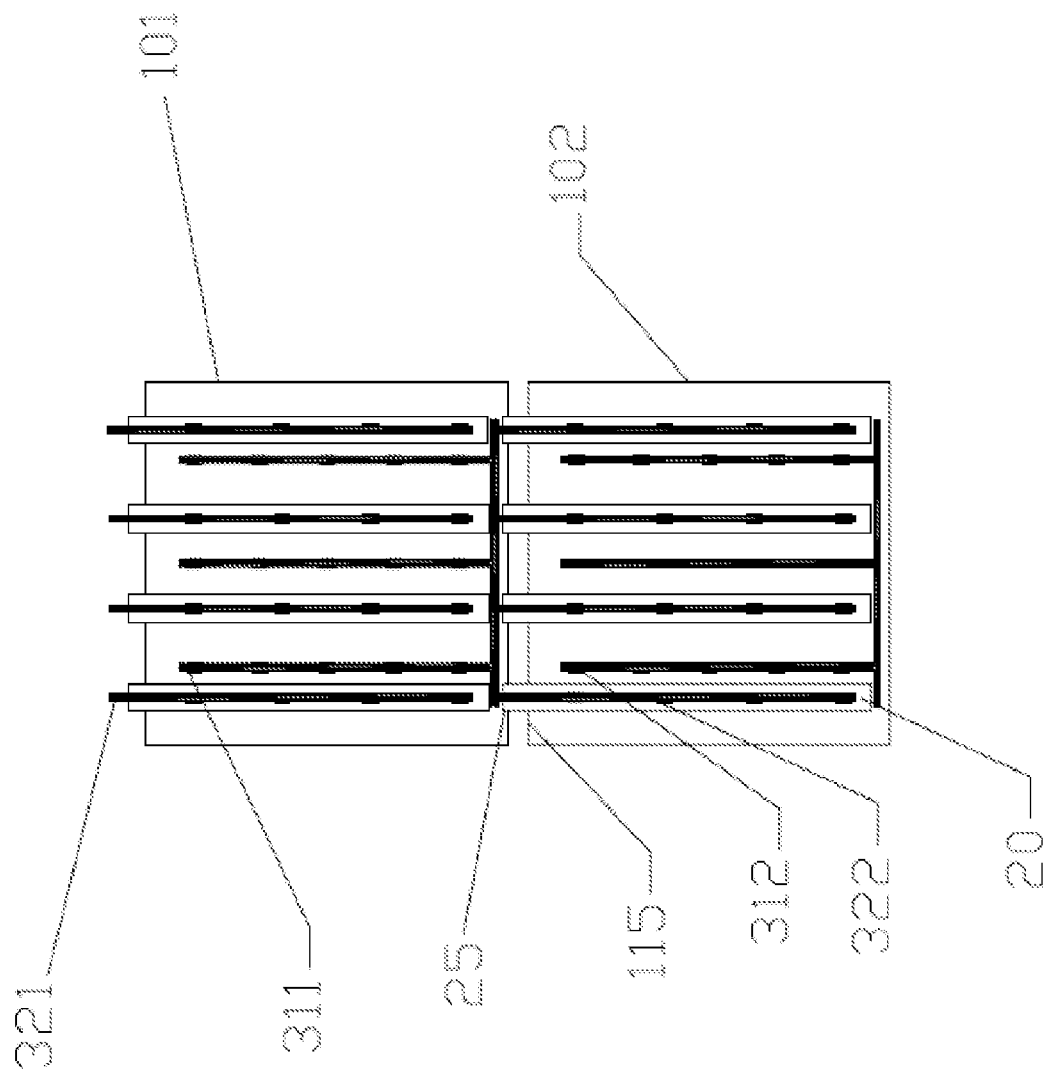
FIG. 7 is a schematic perspective view of connecting two adjacent solar cells in accordance with an exemplary embodiment of the present invention.

As show in FIGS. 3, 5, 6, 7, the insulative strip 20 is first put onto the back surface 11 of the solar cell 11, with the through holes 22 over the negative electrodes 112. One end 25 of the insulative strip 20 extends over the the edge 115 of the back surface 11, and may extend to the back surface of an adjacent solar cell, as illustrated in FIG. 7. Then, the negative connecting strip 32 is mounted onto the back surface 11, with the projections 302 welding to the negative electrodes 112 through the through holes 22. The insulative strip 20 is located between the negative connecting strip 32 and the back surface 11, and prevents contact between the negative connecting strip 32 and the back surface 11 on all directions. Thus the insulative strip 20 can ensure good insulation between the negative connecting strip 32 and the back surface 11 on all directions and avoid short circuit. Afterwards, the positive connecting strip 31 is mounted onto the back surface 11, with the projections 302 connecting to the positive electrodes 111. In another embodiment, the positive connection strip 31 can be mounted before the negative connection strip 32. In yet another embodiment, the insulative strip 20 can be assembled with the negative connecting strip 32 first, then jointly mounted onto the back surface 11.

Figure 9:
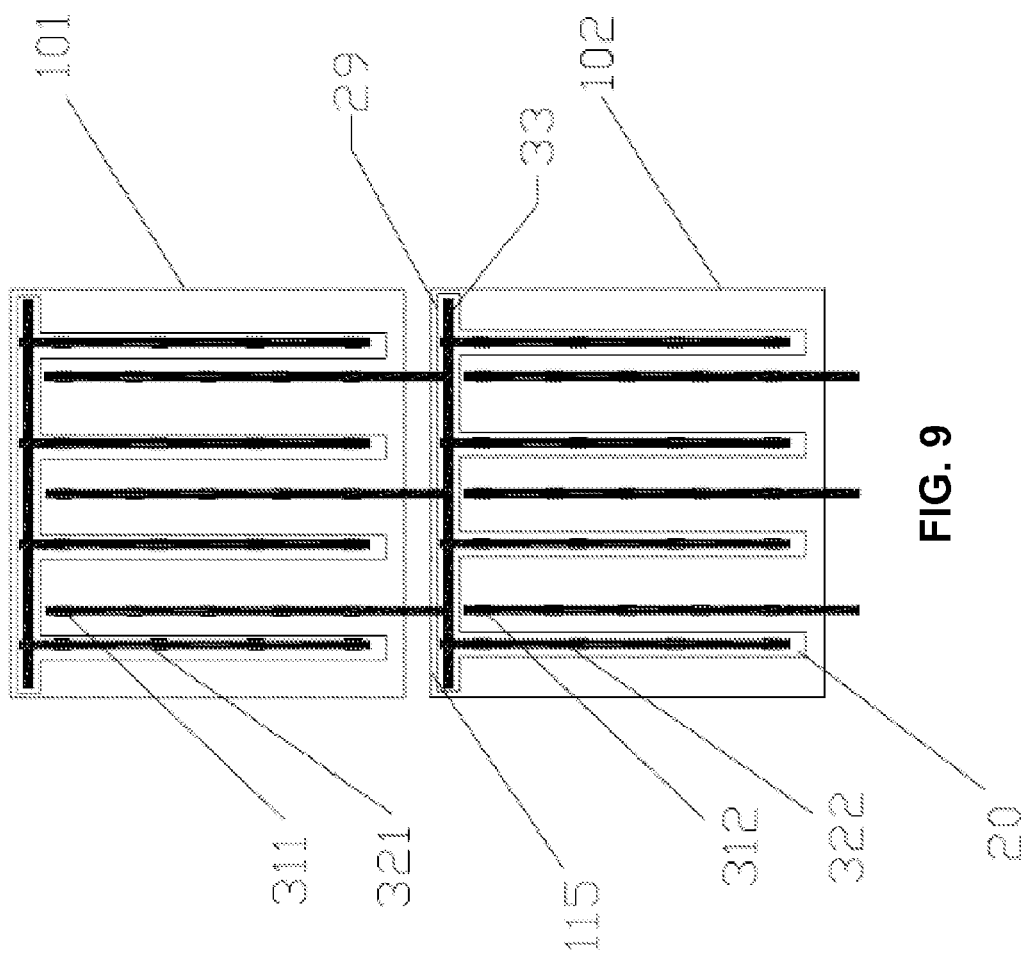
FIG. 9 is a schematic perspective view of connecting two adjacent solar cells in accordance with an exemplary embodiment of the present invention.

FIGS. 6 and 7 illustrates the connection between two adjacent solar cells. A typical solar cell module often includes dozens or more inter-connected solar cells. By way of example, in the following exemplary embodiments, only the connection between two adjacent solar cells will be described. In one embodiment, the solar cell module includes a first solar cell 101 and a second solar cell 102. The connecting member 33 connects to all the positive connecting strips 311 on the back surface 11 of the first solar cell 101, then electrically connects to the negative connecting strips 322 extending from the back surface of the second solar cell 102. As a result, the first solar cell 101 and the second solar cell 102 are electrically connected. Since the connecting member 33 is connected to all the positive connecting strips 311 on the back surface 11 of the first solar cell 101, there is no need to insulate the connecting member 33 from the back surface of the first solar cell 101. In another embodiment as shown in FIG. 9, the connecting member 33 can also be connected to the negative connecting strip 322 of the second solar cell 102 first, then then connects to the positive connecting strips 311 on the back surface of the first solar cell 101. In this embodiment, an additional insulative strip 29 is needed to isolate the connecting member 33 from the back surface 11 of the second solar cell 102. In one embodiment, the insulative strip 29 can be installed the same way as insulative strip 20. Furthermore, the connecting member 33 can be located either on the back surface of the first solar cell 101, or on the back surface of the second solar cell 202. When one end 25 of the insulative strip 20 extends beyond the edge 115 of the second solar cell 102 and reaches to the back surface of the first solar cell 11, the negative connecting strip 322 will be obscured by insulative strip 20, and not visible from the front surface of the solar cell. This improves the appearance of the solar cell module.

Figure 8:
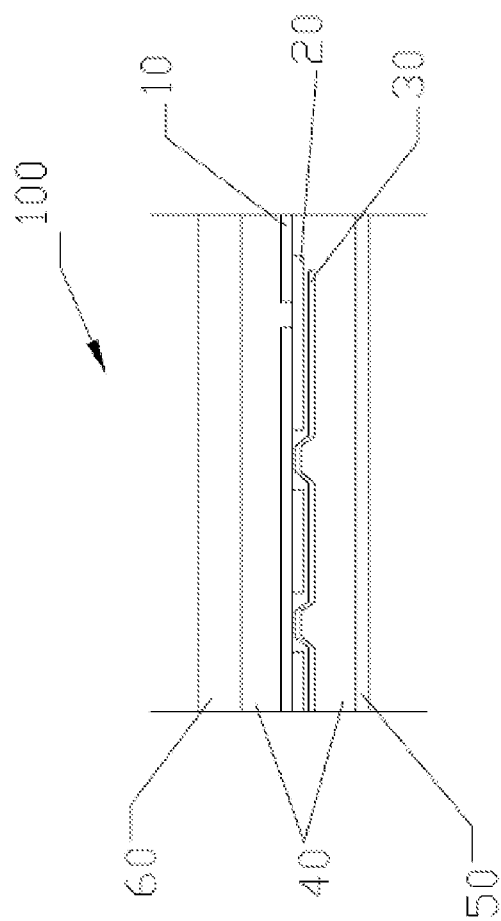
FIG. 8 is a schematic cross-sectional view of a solar cell module in accordance with an exemplary embodiment of the present invention.

FIG. 8 shows a sectional view of a solar cell module that has been been laminated and packaged. There is a back plate 40 under the back surface of the solar cell 10 for protecting the solar cell module 100. The back plate 40 can be made of polyvinyl fluoride composite membrane (TPT). On the top of the front surface of the solar cell module 100 is a glass layer, typically made of tempered glass. The solar cell 10, insulative strip 20 and the welding strip 30 are all located between the glass layer and the back plate 40. There is adhesive on both the top and bottom sides of the solar cell 10. The adhesive can be made of materials such as ethylene-vinyl acetate (EVA) and has some flexibility. The adhesive wraps around the solar cell 10, and makes the solar cell 10, the glass layer and the back plate 40 one unitary module.

In embodiments mentioned above, all the solar cells are of n+/p type having N-type silicon on the front surface of the cell and P-type silicon on the back surface of the cell. This type of solar cell forms a negative electric field on the front surface, and a positive electric field on the back surface, so the negative electrodes on the back surface must be insulated from the positive electric field on the back surface. For p+/n type solar cell, the front surface has P-type silicon, while the back surface has N-type silicon, so the p+/n type solar cell forms a positive electric field on the front surface and a negative electric field on the back surface. The application of the resent invention is not limited to p+/n type solar cell, but can also be extended to n+/p type solar cell. In such embodiments, the positive electrodes (the first electrodes) and the positive connecting strips (the first connecting strips) on the back surface must be insulated from the negative electric field on the back surface. More generally, we define a first electrode having the opposite polarity with the electric field on the back surface, and a second electrode having the opposite polarity with the first electrode. We also define a first connecting strip for connecting with the first electrodes and a second connection strip for connection with the second electrodes.

In sum, the embodiments of the present invention provide an insulative strip 20 between the first connecting strip and the back surface of the solar cell prevent short circuit. This is important for the large-scale industry use of the back contact solar cell modules.

The embodiments of the present invention may be used to electrically connecting light to current converter devices, such as solar cells. The light to current converter devices may include via holes extending through the cell substrate and may include through-hole electrodes disposed within the via holes. The through-hole electrodes may be made from one or more materials and may be hollow, partially hollow, or fully filled. Front electrodes and rear electrodes may also be formed on the device and can be made of the same or different materials as the through-hole electrode. The devices may further include emitters located only on the top surface of the cell, located on the top surface and symmetrically along a portion of the inner surface of the via holes, located on the top surface and asymmetrically along a portion of the inner surface of the via holes, or located on the top surface and full inner surface of the via holes. Processes for making the described light to current converter devices are also disclosed.

FIGS. 10-13 illustrate exemplary P-N junctions that may be used in a light to current converter device, such as a solar cell. The exemplary P-N junctions shown in FIGS. 10-13 do not include a deposited dielectric layer or an emitter located on the back surface of the substrate. The absence of a back side emitter allows a device having a P-N junction like that shown in FIGS. 10-13 to be manufactured without performing double side diffusion or back contact isolation. Additionally, the absence of a deposited dielectric layer allows the device to be manufactured without performing dielectric layer deposition and removal as is required to manufacture conventional P-N junctions. As a result, a device having a P-N junction similar or identical to those shown in FIGS. 10-13 may be cheaper and quicker to manufacture than those having a conventional P-N junction.

Specifically, FIG. 10 illustrates an exemplary P-N junction having an emitter 2 that covers the front surface of the substrate 1 and the full inner surface of the via hole 3. The substrate 1 may include monocrystalline silicon or polycrystalline silicon having a first doping type (e.g., P or N) while the emitter 2 may have an opposite doping type (e.g., N or P). In this example, since the emitter 2 may not cover the backside of substrate 1, the backside of substrate 1 may remain the same doping type as substrate 1. In other examples, other types of opposite conductivity type semiconductors may be used for substrate 1 and emitter 2.

FIG. 11 illustrates another exemplary P-N junction having an emitter 2 that covers the front surface of the substrate 1 and symmetrically covers a portion of the inner surface of the via hole 3. The substrate 1 may include monocrystalline silicon or polycrystalline silicon having a first doping type (e.g., P or N) while the emitter 2 may have an opposite doping type (e.g., N or P). In this example, since the emitter 2 may not cover a portion of the inner surface of via hole 3 and the backside of substrate 1, the uncovered portion of the inner surface of via hole 3 and the backside of substrate 1 may remain the same doping type as substrate 1.

Figure 12:
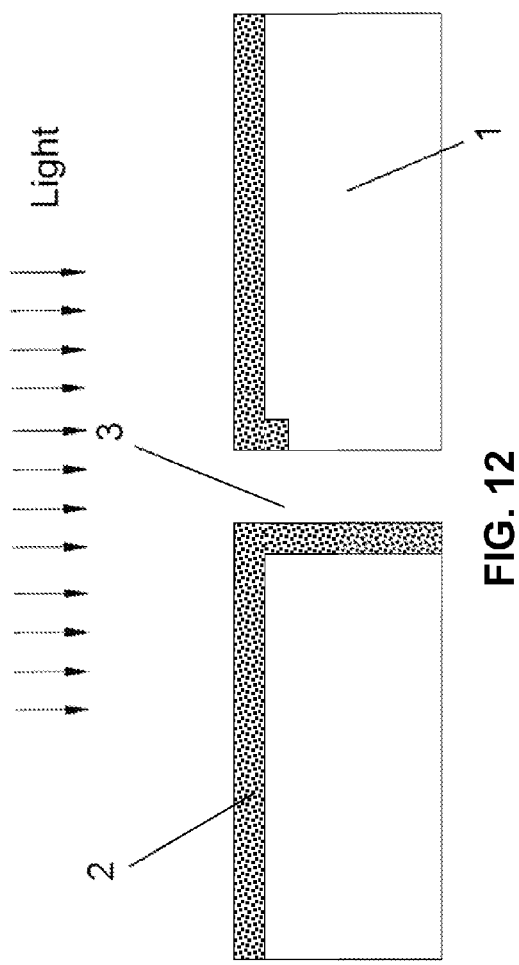

FIG. 12 illustrates yet another exemplary P-N junction having an emitter 2 that covers the front surface of the substrate 1 and and asymmetrically covers a portion of the inner surface of the via hole 3. The substrate 1 may include monocrystalline silicon or polycrystalline silicon having a first doping type (e.g., P or N) while the emitter 2 may have an opposite doping type (e.g., N or P). In this example, since the emitter 2 may not cover a portion of the inner surface of via hole 3 and the backside of substrate 1, the uncovered portion of the inner surface of via hole 3 and the backside of substrate 1 may remain the same doping type as substrate 1.

Figure 13:
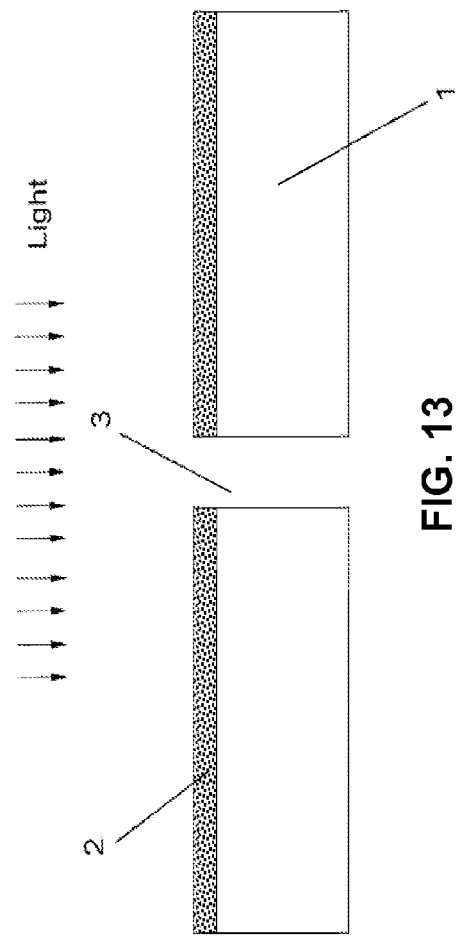

FIG. 13 illustrates yet another exemplary P-N junction having an emitter 2 that covers only the front surface of the substrate 1. The substrate 1 may include monocrystalline silicon or polycrystalline silicon having a first doping type (e.g., P or N) while the emitter 2 may have an opposite doping type (e.g., N or P). In this example, since the emitter 2 may not cover the inner surface of via hole 3 and the backside of substrate 1, the the inner surface of via hole 3 and the backside of substrate 1 may remain the same doping type as substrate 1.

Various embodiments of light to current converter devices having exemplary P-N junctions similar or identical to those shown in FIGS. 10-13 are described below with respect to FIGS. 14-19.

Figure 14:
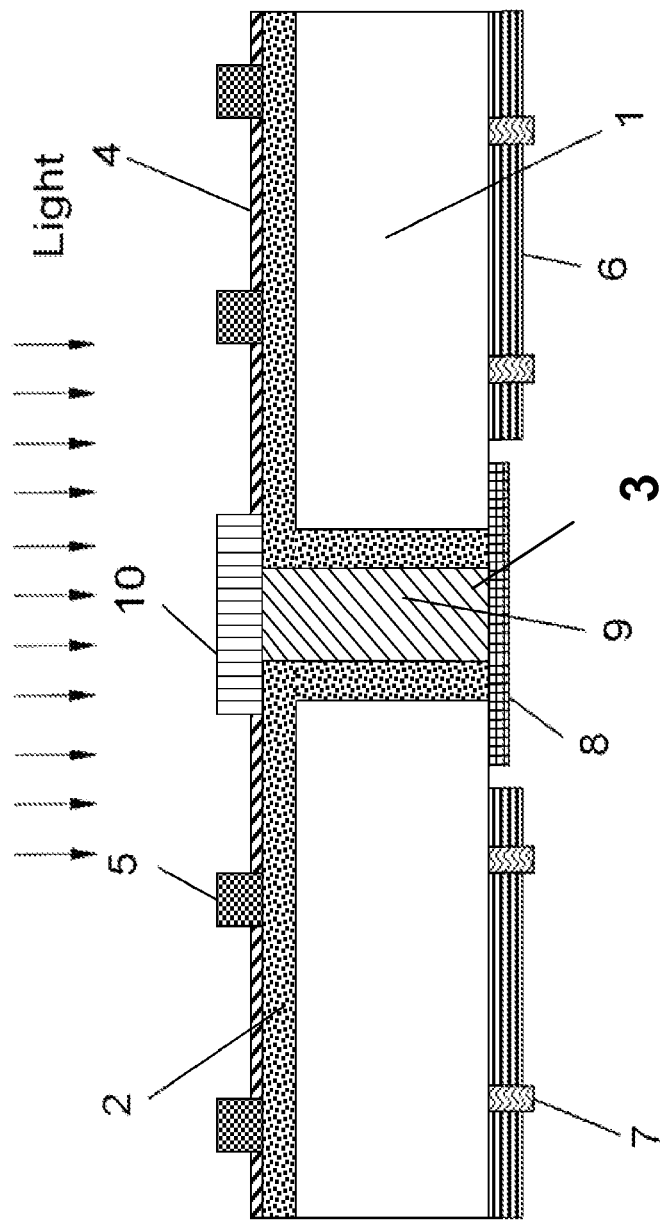
FIGS. 14-19 are schematic cross-sectional views of light to current converter devices according to various embodiments.

FIG. 14 illustrates an exemplary light to current converter device 140 having a P-N junction similar to that shown in FIG. 10. Specifically, device 140 includes a P-type or N-type semiconductor substrate 1 with one or more via holes 3 (e.g., 9, 13, 20, 25, 40, 48, 60, or 80 via holes 3) penetrating the substrate 1. An N-type (for P-type substrate 1) or P-type (for N-type substrate 1) emitter 2 may be formed on the front surface of the substrate 1 and the full inner surface of the via hole 3.

Device 140 may further include front electrodes 5 and one or more anti-reflective films 4, for example, one or more layers of SiN, $SiO_2$/SiN, $Si_3N_4$, $TiO_2$, SiNx, or the like. The one or more anti-reflective films 4 may be used to absorb additional light and improve light conversion efficiency. A via front collector 10 (electrode) may also be placed on a portion of emitter 2 and above via hole 3. Via hole 3 may be at least partially filled with a via hole electrode 9 that is electrically coupled to via front collector 10 and a via rear collector 8 (electrode) that may be disposed below via hole 3. Via front collector 10, via hole electrode 9 (electrode), and via rear collector 8 may collectively be referred to herein as a "through-hole electrode." Device 140 may further include rear electrodes 7 (or back electrodes) disposed below substrate 1. Front electrodes 5, via front collector 10, inner via hole electrode 9, via rear collector 8, and rear electrodes 7 may be made of any conductive material, such as metals, alloys, conductive pastes, conductive compounds, conductive films, or the like. In some examples, commercially available conductive pastes that are suitable for forming electrodes in a solar cell may be used. For example, DuPont Microcircuit Materials of the United States offers several types of silver-based DuPont Solamet photovoltaic metallization pastes, including Solamet PV17A, PV16x, PVD2A, PV173, PV502, PV505, PV506, and PV701, as described by the website at http://www2.dupont.com/Photovoltaics/en_US/assets/downloads/pdf/PV_SolametProductOverview.pdf of Dupont. Targray Technology International Inc. of Canada also offers many types of the HeraSol Ag Paste compositions, including SOL953, SOL953, SOL90235H, SOL9273M, SOL9318, SOL230, CL80-9381M, CL80-9383M, SOL108, and SOL9400, as described by the website at http://www.targray.com/solar/crystalline-cell-materials/silver-paste.php of Targray. Furthermore, some suppliers can customize their pastes to the specific manufacturing process to increase efficiency and provide wider processing windows. While specific pastes have been provided above, it should be appreciated that other known pastes may be used.

Additionally, front electrodes 5, via front collector 10, inner via hole electrode 9, via rear collector 8, and rear electrodes 7 may be made from the same or different materials, and may each be made of one or more materials. For instance, in some examples, front electrodes 5, via front collector 10, inner via hole electrode 9, and via rear collector 8 may be made of silver, while the rear electrodes 7 may be made of aluminum, or vice versa. In other examples, front electrodes 5, via front collector 10, inner via hole electrode 9, and via rear collector 8 may be made of aluminum, while the rear electrodes 7 may be made of silver. Moreover, the via front collector 10, the inner via hole electrode 9, and the via rear collector 8 can be hollow, partially filled, or fully filled, and may form a unitary body or may form multiple segments. In the example shown in FIG. 8, the via front collector 10, the inner via hole electrode 9, and the via rear collector 8 are fully filled.

Front electrodes 5, via front collector 10, inner via hole electrode 9, and the via rear collector 8 may be coupled together such that during operation, electric current may be generated by the light receiving surface of device 140 and directed to via front collector 10 by front electrodes 5. From via front collector 10, the current may be directed through via hole electrode 9 to via rear collector 8. Rear electrodes 7 may be electrically isolated from via rear collector 8 and may collect opposite conductivity current on the back surface of device 140. In this way, electrodes of opposite conductivity may be placed on the same side (back surface) of device 140 without interfering with light absorption on the front surface of the device.

Device 140 may further include impurity layer 6. In some examples, an $N^+$ (for N-type substrate 1) or $P^+$ (for P-type substrate 1) impurity layer 6 may be positioned on the bottom of substrate 1 to form a back surface field. In other examples, impurity layer 6 may include an $N^+$ (for N-type substrate 1) doping region, $P^+$ (for P-type substrate 1) doping region, SiNx, $SiO_2$, or combinations thereof. Device 140 may further include light-trapping structures on the light-receiving surface of the device. In some examples, the surface may be textured with a random arrangement of pyramids, inversed pyramids, honeycomb structures, and the like. Using these structures, a ray of light may be reflected toward a neighboring structure resulting in a greater amount of light absorption. To further improve the absorption of light, the light-trapping surface may be optically dark or black.

Figure 15:
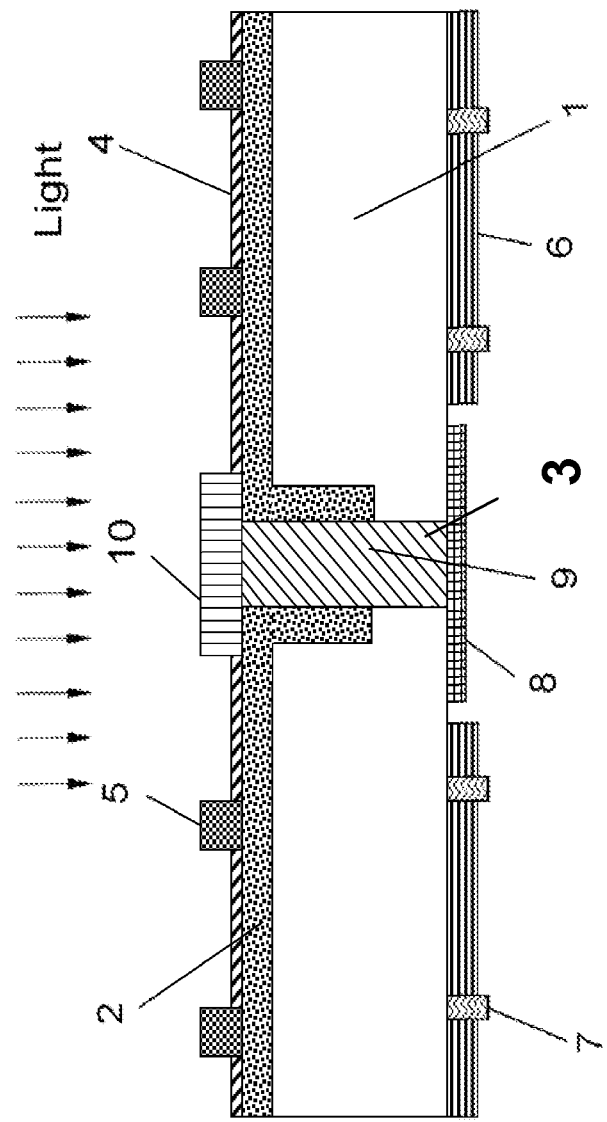

FIG. 15 illustrates another exemplary light to current converter device 150 having a P-N junction similar to that shown in FIG. 11. Device 150 may be similar to device 140, except that the emitter 2 may symmetrically cover only a portion of the inner surface of the via hole 3.

Figure 16:
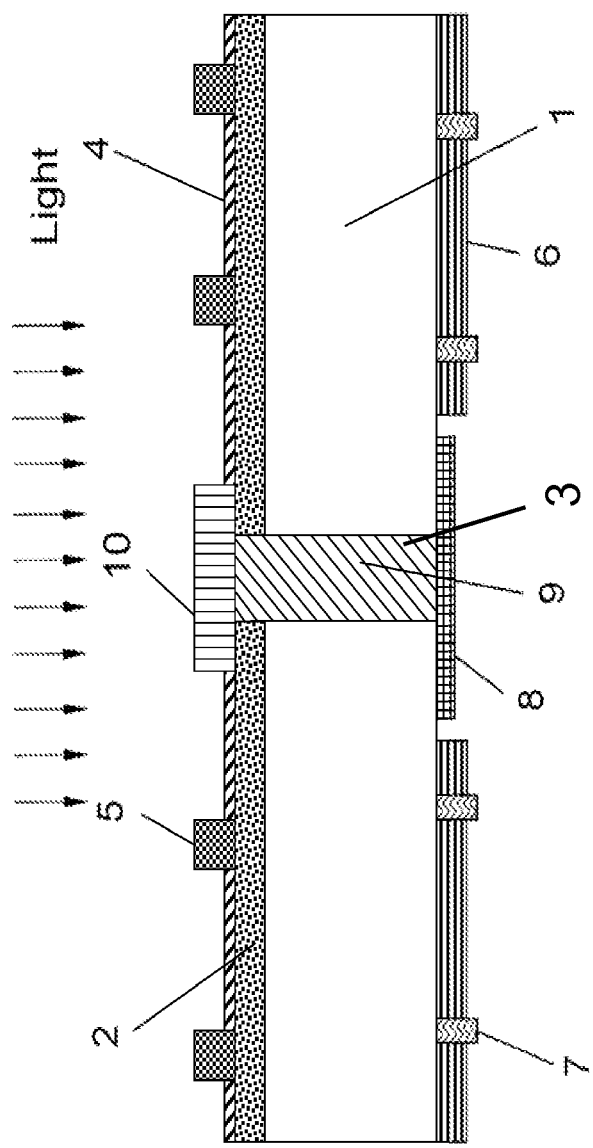

FIG. 16 illustrates an exemplary light to current converter device 160 having a P-N junction similar to that shown in FIG. 13. Device 160 may be similar to device 140, except that the emitter 2 only covers the front surface of substrate 1 and does not cover the inner surface of the via hole 3.

Figure 17:
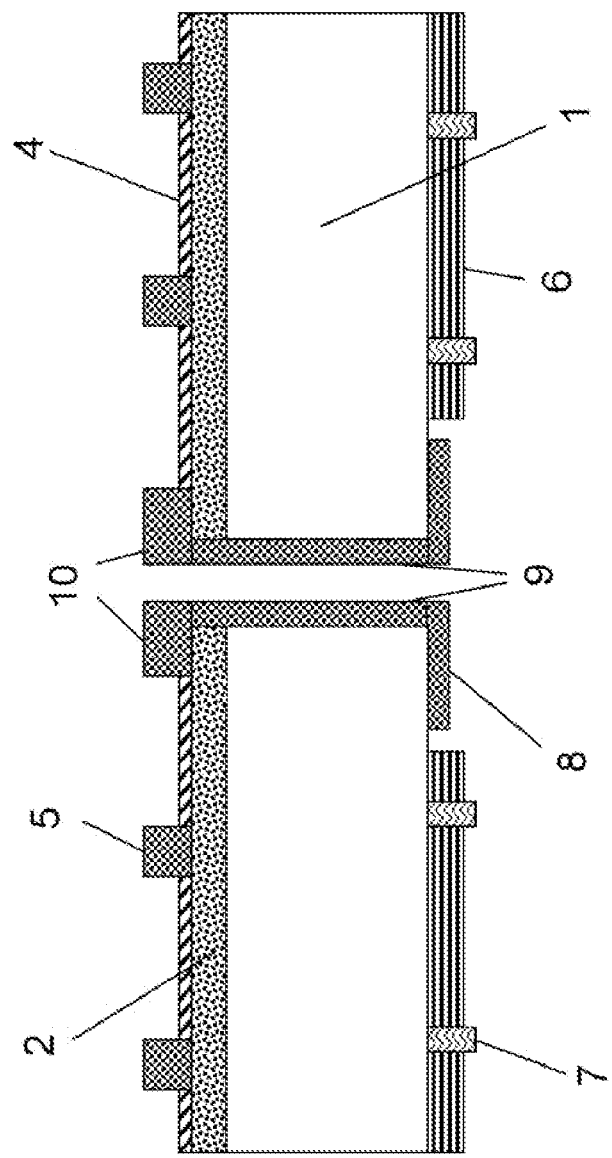

FIG. 17 illustrates an exemplary light to current converter device 170 having a P-N junction similar to that shown in FIG. 13. Device 170 may be similar to device 160 except that via front collector 10, via hole electrode 9, and via rear collector 8 may be hollow. Additionally, front electrodes 5, via front collector 10, via hole electrode 9, and via rear collector 8 may be made from the same material and may form a unitary body. In some examples, front electrodes 5, via front collector 10, inner via hole electrode 9, and via rear collector 8 may be made of silver, while the rear electrodes 7 may be made of aluminum. In other examples, front electrodes 5, via front collector 10, inner via hole electrode 9, and via rear collector 8 may be made of aluminum, while the rear electrodes 7 may be made of silver.

Figure 18:
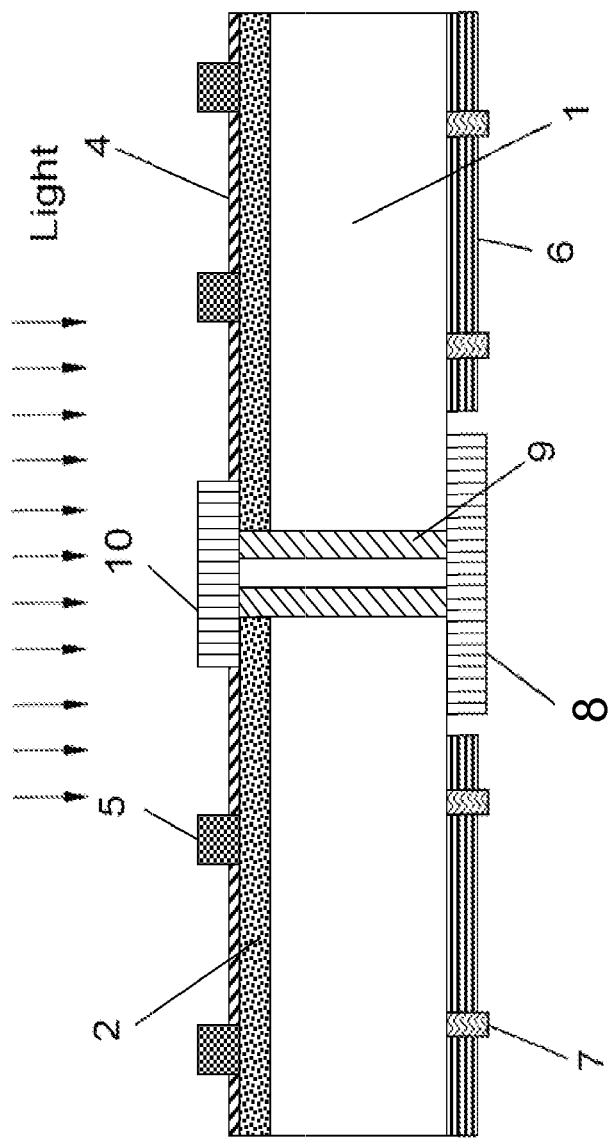

FIG. 18 illustrates another exemplary light to current converter device 180 having a P-N junction similar to that shown in FIG. 13. Device 180 may be similar to device 160 except that via front collector 10 and via rear collector 8 may be fully filled while via hole electrode 9 may be hollow. Additionally, front electrodes 5 may be made from a first material, via front collector 10 and via rear collector 8 may be made from a second material, and via hole electrode 9 may be made from a third material.

Figure 19:
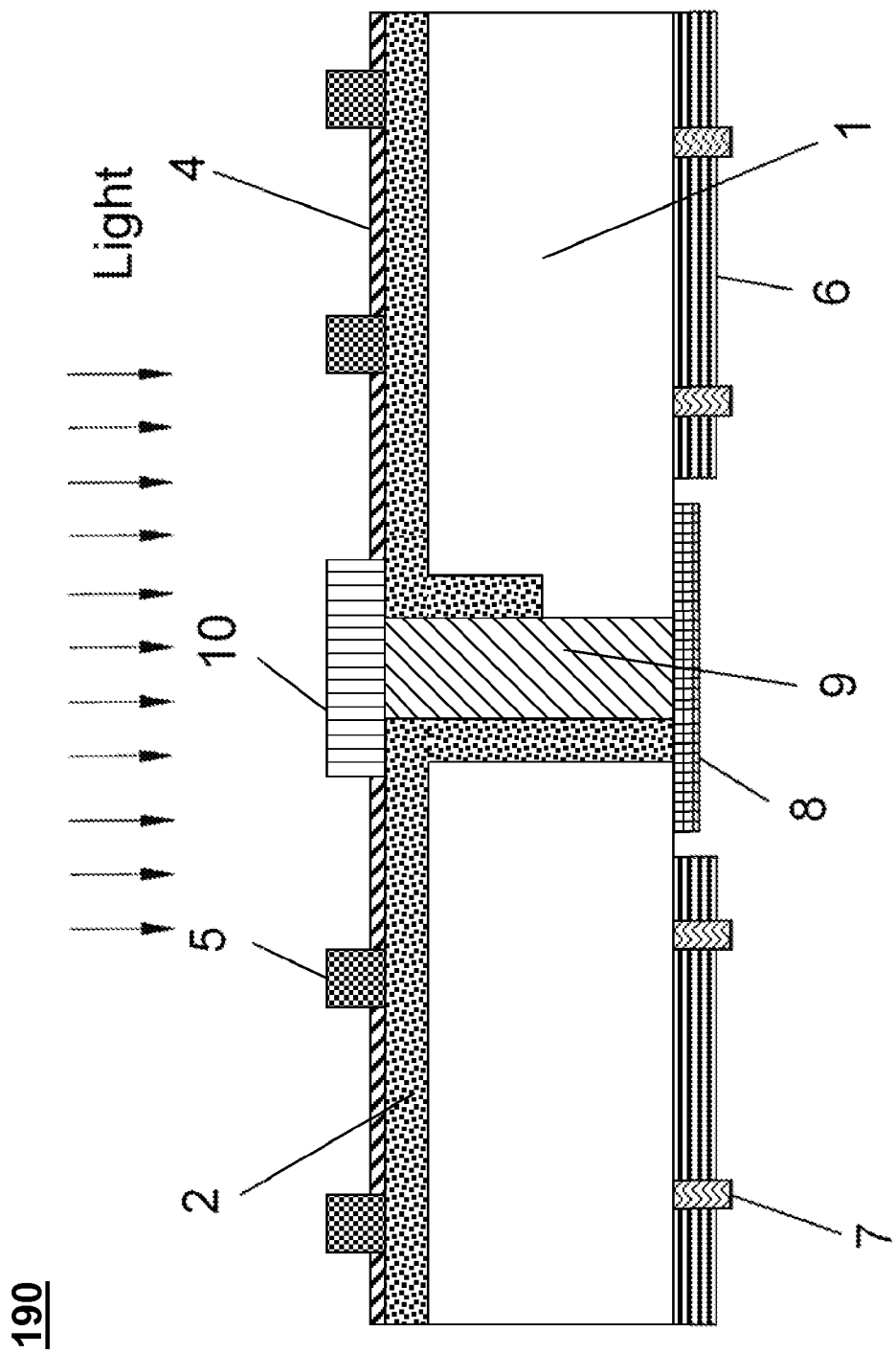

FIG. 19 illustrates another exemplary light to current converter device 190 having a P-N junction similar to that shown in FIG. 12. Device 190 may be similar to device 140, except that the emitter 2 asymmetrically covers only a portion of the inner surface of the via hole 3.

It should be appreciated by one or ordinary skill that any one of the P-N junctions shown in FIGS. 10-13 may be used to make light to current converter devices having any combination of materials for front electrodes 5, rear electrodes 7, via hole electrode 9, via front collector 10, and via rear collector 8, and having a hole through all, a portion, or none of via hole electrode 9, via front collector 10, and via rear collector 8.

Although embodiments have been described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A solar cell module comprising:
a solar cell comprising a back surface with a plurality of first electrodes and a plurality of second electrodes formed thereon, the plurality of first electrodes and the plurality of second electrodes being of opposite polarities, the back surface being configured to form an electric field thereon of the opposite polarity as the plurality of first electrodes;
a first connecting strip electrically connecting a first subset of the plurality of first electrodes;
a second connecting strip electrically connecting a second subset of the plurality of first electrodes;
a third connecting strip electrically connecting the plurality of second electrodes;
a first discrete insulative member positioned between the back surface and the first connecting strip without being positioned between the back surface and the third connecting strip; and
a second discrete insulative member positioned between the back surface and the second connecting strip without being positioned between the back surface and the third connecting strip, wherein the second discrete insulative member is spaced apart from the first discrete insulative member.

2. The solar cell module of claim 1, wherein the first discrete insulative member and the second discrete insulative member are each separable from the back surface of the solar cell.

3. The solar cell module of claim 1, wherein the first discrete insulative member and the second discrete insulative member each comprise a material selected from the group consisting of expandable polyethylene (EPE), thermoplastic elastomer (TPE), polyvinyl fluoride composite membrane (TPT), and silicon.

4. The solar cell module of claim 1, wherein the first discrete insulative member comprises a plurality of through holes through which the first connecting strip is connected to the first subset of the plurality of first electrodes.

5. The solar cell module of claim 1, wherein a first end of the first discrete insulative member extends beyond a first edge of the back surface without a second end of the first discrete insulative member extending beyond a second edge of the back surface, and wherein the first end is opposite to the second end and the first edge is opposite to the second edge.

6. The solar cell module of claim 1, wherein each of the first discrete insulative member and the second discrete insulative member comprise an insulative material adhered to the back surface.

7. The solar cell module of claim 6, wherein the insulative material comprises silicone.

8. The solar cell module of claim 4, wherein the first connecting strip comprises a base strip and a plurality of projections projecting from a surface on which the base strip resides.

9. The solar cell module of claim 8, wherein the plurality of projections correspond to the first subset of the plurality of first electrodes, and each projection projects into a through hole to electrically connect to a corresponding first electrode.

10. The solar cell module of claim 1, wherein the plurality of first electrodes protrude out of the back surface.

11. The solar cell module of claim 1, further comprises a connection member electrically connecting the third connecting strip.

12. The solar cell module of claim 1, wherein a cross-section of each of the plurality of first electrode is rectangle-shaped.

13. The solar cell module of claim 1, wherein the plurality of first electrodes are negative electrodes.

14. The solar cell module of claim 1, wherein the plurality of first electrodes are positive electrodes.

15. A solar cell module comprising:
a first solar cell;
a second solar cell adjacent to the first solar cell, each of the first solar cell and the second solar cell comprising:
a front surface configured to be exposed to light;
a back surface with a plurality of first electrodes and a plurality of second electrodes formed thereon, the plurality of first electrodes and the plurality of second electrodes being of opposite polarities, the back surface being configured to form an electric field thereon of the opposite polarity as the plurality of first electrodes;
a first connecting strip electrically connecting a first subset of the plurality of first electrodes;
a second connecting strip electrically connecting a second subset of the plurality of first electrodes;
a third connecting strip electrically connecting the plurality of second electrodes;
a first discrete insulative member positioned between the back surface and the first connecting strip without being positioned between the back surface and the third connecting strip; and
a second discrete insulative member positioned between the back surface and the second connecting strip without being positioned between the back surface and the third connecting strip, wherein the second discrete insulative member is spaced apart from the first discrete insulative member; and
a connection member electrically connecting the third connecting strip of the first solar cell and the first connecting strip of the second solar cell.

16. The solar cell module of claim 15, wherein the first discrete insulative member comprises a plurality of through holes corresponding to the first subset of the plurality of first electrodes, and the first connecting strip comprises a plurality of projections for projecting into the plurality of through holes to electrically connect to the first subset of the plurality of first electrodes.

17. The solar cell module of claim 16, wherein the connection member is located on the back surface of the first solar cell and connected to the third connecting strip of the first solar cell.

18. The solar cell module of claim 16, wherein the connection member is located on the back surface of the second solar cell and connected to the first connecting strip of the second solar cell.

19. The solar cell module of claim 18, further comprises a third discrete insulative member positioned between the connection member and the back surface of the second solar cell.

20. The solar cell module of claim 18, wherein the plurality of first electrodes are negative electrodes.

21. The solar cell module of claim 18, wherein the plurality of first electrodes are positive electrodes.

22. A method of manufacturing a solar cell module, comprising the steps of:
forming a first solar cell and a second solar cell adjacent to the first solar cell, each of the first solar cell and the second solar cell comprising a front surface configured to be exposed to light and a back surface with a plurality of first electrodes and a plurality of second electrodes formed thereon, the plurality of first electrodes and the plurality of second electrodes being of opposite polarities, the back surface being configured to form an electric field thereon of the opposite polarity as the plurality of first electrodes;
for each of the first solar cell and the second solar cell:
connecting the plurality of second electrodes electrically through a third connecting strip;
forming a first discrete insulative member around a first subset of the plurality of first electrodes;
forming a second discrete insulative member around a second subset of the plurality of first electrodes;
connecting the first subset of the plurality of first electrodes electrically through a first connecting strip, wherein said first discrete insulative member is positioned between said first connecting strip and the back surface without being positioned between the back surface and the third connecting strip; and
connecting the second subset of the plurality of first electrodes electrically through a second connecting strip, wherein said second discrete insulative member is positioned between said second connecting strip and the back surface without being positioned between the back surface and the third connecting strip, and wherein said second discrete insulative member is spaced apart from said first discrete insulative member; and
connecting the third connecting strip of the first solar cell and the first connecting strip of the second solar cell electrically through a connection member.

23. The method of claim 22, further comprising:
forming a plurality of projections on the first connecting strip corresponding to the first subset of the plurality of first electrodes; and
connecting each of the plurality of projections on the first connecting strip with a corresponding first electrode electrically.

24. The method of claim 23, wherein forming the first discrete insulative member comprises depositing an insulative material on the back surface where the first connecting strip is located and the plurality of first electrodes are not located.

25. The method of claim 22, wherein forming the first discrete insulative member comprises providing an insulative strip on the back surface where the first connecting strip is located, the insulative strip comprises a plurality of through holes corresponding to the subset of the plurality of first electrodes.

26. The solar cell module of claim 1, wherein the solar cell comprises a light to current convertor device comprising:
a semiconductor substrate of a first conductive type, having a front surface operable to receive impinging light and a rear surface opposite to the front surface;
a via hole extending through the semiconductor substrate from the front surface to the rear surface;
a semiconductor layer of a second conductive type, the second conductive type opposite the first conductive type, wherein the semiconductor layer of the second conductive type covers only the front surface of the semiconductor substrate;
an inner via hole electrode disposed within the via hole and directly contacting an inner surface of the via hole;
a via front collector covering at least a portion of a front side of the via hole, the via front collector being coupled to the inner via hole electrode; and
a via rear collector covering at least a portion of a rear side of the via hole, the via rear collector being coupled to the inner via hole electrode.

27. The solar cell module of claim 26, wherein the semiconductor layer of the second conductive type does not cover a portion of the rear surface of the semiconductor substrate or a portion of the inner surface of the via hole.

28. The solar cell module of claim 1, wherein the solar cell comprise a light to current convertor device comprising:
a semiconductor substrate of a first conductive type, having a front surface operable to receive impinging light and a rear surface opposite to the front surface;
a via hole extending through the semiconductor substrate from the front surface to the rear surface;
a semiconductor layer of a second conductive type, the second conductive type opposite the first conductive type, wherein the semiconductor layer of the second conductive type covers only the front surface of the semiconductor substrate and at least a portion of an inner surface of the via hole;
an inner via hole electrode disposed within the via hole and directly contacting the inner surface of the via hole or the semiconductor layer of the second conductive type located within the via hole;
a via front collector covering at least a portion of a front side of the via hole, the via front collector being coupled to the inner via hole electrode; and
a via rear collector covering at least a portion of a rear side of the via hole, the via rear collector being coupled to the inner via hole electrode.

29. The solar cell module of claim 26, wherein the semiconductor layer of the second conductive type does not cover a portion of the rear surface of the semiconductor substrate or a portion of the inner surface of the via hole.

30. The solar cell module of claim 15, wherein in each of the first solar cell and the second solar cell:
a first end of the first discrete insulative member extends beyond a first edge of the back surface without a second end of the first discrete insulative member extending beyond a second edge of the back surface, and
the first end is opposite to the second end and the first edge is opposite to the second edge.

* * * * *